United States Patent [19]

Wakabayashi

[11] Patent Number: 5,075,532
[45] Date of Patent: Dec. 24, 1991

[54] SPATTER-FREE ELECTRON BEAM WELDING APPARATUS WITH SPATTER CATCHING DEVICE ASSOCIATED THEREWITH

[75] Inventor: Masaru Wakabayashi, Shizuoka, Japan

[73] Assignee: Jatco Corporation, Shizuoka, Japan

[21] Appl. No.: 540,333

[22] Filed: Jun. 19, 1990

[51] Int. Cl.⁵ ............................................. B23K 15/00
[52] U.S. Cl. ........................... 219/121.13; 219/121.21
[58] Field of Search .................. 219/121.13, 121.14, 219/121.22, 121.3, 121.5, 137.43, 121.21

[56] References Cited

U.S. PATENT DOCUMENTS

| | | | |
|---|---|---|---|
| Re. 27,005 | 12/1970 | Wingfield et al. | 219/121.13 X |
| 3,243,571 | 3/1966 | Schmerling | 219/137.43 |
| 3,322,930 | 5/1967 | Sciaky | 219/121.13 X |
| 3,430,837 | 3/1969 | Hein | 219/137.43 X |
| 3,458,682 | 7/1969 | Best | 219/121.13 |
| 4,175,226 | 11/1979 | Kappelsberger et al. | 219/121.14 |

FOREIGN PATENT DOCUMENTS 39156  9/1986  Japan ................ 219/121.21

Primary Examiner—C. L. Albritton
Attorney, Agent, or Firm—Ronald P. Kananen

[57] ABSTRACT

An electron beam welding apparatus performs electron welding by irradiating electron beam on a workpiece. At an arcing point where the electron beam is irradiated, welding spatter is generated. The welding spatter can fly in a working chamber and can adhere to a housing of a welding apparatus. For preventing this, a spatter catching means is provided for preventing the welding spatter from directly adhering to the peripheral wall surface of the housing. Preferably, a spatter catching means comprises a cover member surrounding the workpiece so that the area of flying of the welding spatter is limited within the surrounded region.

26 Claims, 3 Drawing Sheets

SPATTER-FREE ELECTRON BEAM WELDING APPARATUS WITH SPATTER CATCHING DEVICE ASSOCIATED THEREWITH

BACKGROUND OF THE INVENTION

1. Field of the Invention

The present invention relates generally to an electron beam welding apparatus. More specifically, the invention relates to an electron beam welding apparatus which is free from welding spatter adhering to or sticking on the peripheral walls of the apparatus. The present invention also relates to a method for easily removing welding spatter in the apparatus.

2. Description of the Background Art

Electron beam welding technology is a modern welding technology which has a much higher welding efficiency in comparison with conventional welding processes, such as arc welding. As is well known, the electron beam used in electron beam welding is a higher energy than the arc beam used in arc welding. Electron beam welding apparatuses have been disclosed in Japanese Patent First (unexamined) Publications (Tokkai) Showa 62-238084, published on Oct. 19, 1987 and 63-149089, published on June 21, 1988, and Japanese Utility Model First (unexamined) Publication (Jikkai) Showa 63-116192, published on July 27, 1988.

In the conventional electron beam welding apparatuses problems are encountered. For example, the electron beam welding may generate spatter distributed outside of the work area. The welding spatter then adheres to or accumulates on the inner periphery of an enclosed apparatus housing. Since such welding spatter blocks on the inner periphery may contain air, the air carried with the blocks of the welding spatter may require prolonged periods of time for establishing the required degree of vacuum to successfully perform the electron beam welding, thereby lowering the efficiency of the electron beam welding operation.

Furthermore, since the welding spatter may be firmly adhered to or stuck on the periphery of the apparatus, the operation for removing the stuck spatter becomes difficult and require a relative long period of time.

SUMMARY OF THE INVENTION

In view of the aforementioned drawback in the prior art, it is an object of the present invention to provide an electron beam welding apparatus which is free from welding spatter which adheres to the inner periphery of the apparatus.

Another object of the invention is to provide an electron beam apparatus which has means for catching the welding spatter so that no welding spatter will reach the peripheral wall of the apparatus.

In order to accomplish the aforementioned and other objects, the invention includes an electron beam welding apparatus which performs electron welding by irradiating electron beam on a workpiece. At an arcing point, where the electron beam is irradiated, welding spatter is generated. The welding spatter can fly into a working chamber and stick to a housing of a welding apparatus. The instant invention provides a spatter catching means for preventing the welding spatter from directly sticking on the peripheral wall surface of the housing. Preferably, a spatter catching means comprises a cover member surrounding the workpiece so that the area of impact of the welding spatter is limited within the surrounding region.

According to one aspect of the invention, an electron beam welding apparatus comprises:

a hollow housing defining a working chamber, in which electron beam welding is performed;

an electron gun for generating an electron beam to be irradiated on a workpiece placed within the working chamber; and a welding spatter catching means for surrounding the workpiece to prevent welding spatter from directly sticking on the inner periphery of the housing.

It is preferred that the welding spatter catching means comprises a cover member surrounding the workpiece to localize accumulation of the welding spatter thereon. In such case, the cover member may be removably installed within the working chamber. Preferably, the cover member is assembled with the workpiece before placement within the working chamber and removed together with the workpiece. The cover member is made of a magnetically non-conductive material.

On the other hand, it is further preferred that the cover member be oriented with respect to the workpiece so that the axis thereof is offset from the axis of the workpiece for orienting the portion directly mating with an arcing point at a distance greater than the other portions. Preferably, the distance from the arcing point to the directly mating portion of the cover member is greater than or equal to 10 mm.

The welding spatter catching means may further comprise a spatter catcher layer formed on the periphery of the cover member mating with the workpiece. The material for forming the spatter catcher layer may be one of a number of known materials which are magnetically non-conductive and which have a high heat resistance and property for easy removal from the inner periphery of the cover member. For example, polishing powder, a clay, a thin metal, having high heat resistance and which is magnetically non-conductive or a synthetic resin having a high heat resistance and which is magnetically non-conductivity.

Alternatively, the welding spatter catching means may also comprise a spatter catcher layer formed on the inner periphery of the working chamber.

DESCRIPTION OF THE PREFERRED EMBODIMENT

Figure 1:
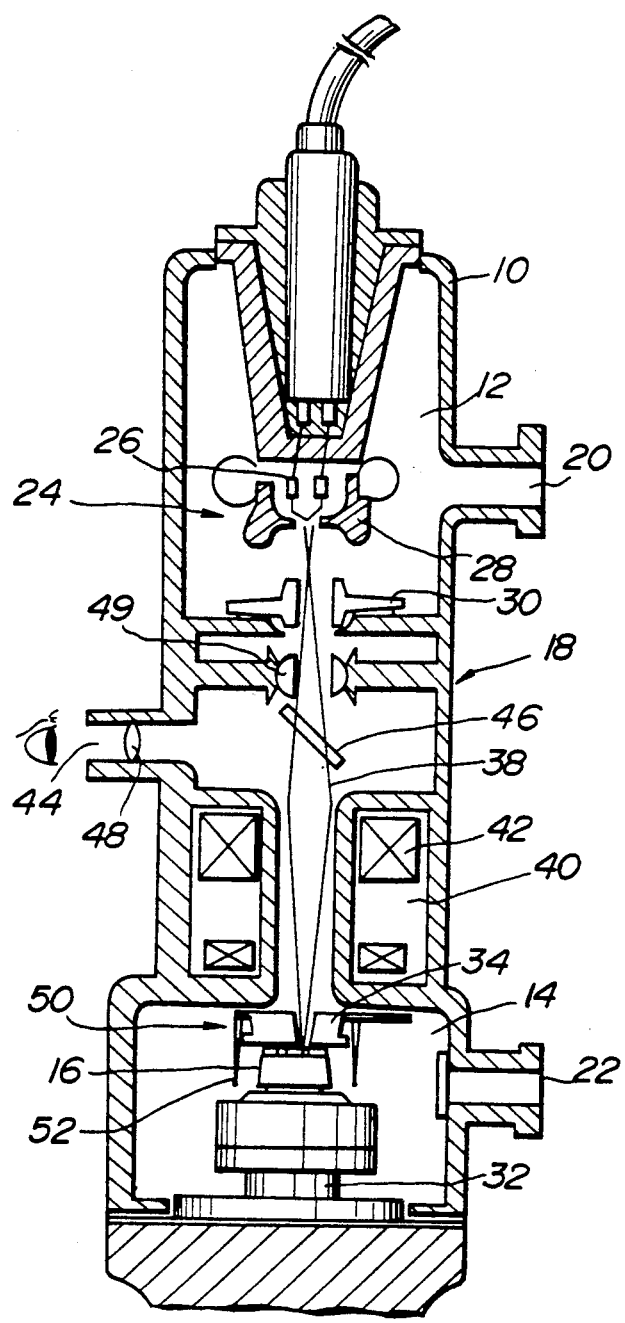
FIG. 1 is an illustration showing in cross section the general construction of an electron beam welding apparatus, for which the preferred embodiment of a spatter catching device according to the present invention is applicable.

Referring now to the drawings, FIG. 1 is an illustration of a per se known electron beam welding apparatus. The electron beam welding apparatus of FIG. 1 has an enclosed housing 10. The housing 10 defines an electron gun chamber 12 and a working chamber 14, in which a workpiece 16 is placed for performing electron beam welding. The electron gun chamber 12 and the working chamber 14 are communicated by an electron beam path 18. The electron gun chamber 12 and the working chamber 14 respectively have vacuum ports 20 and 22 connected to a vacuum source (not shown) so that a vacuum is introduced into both chambers for maintaining the interior space of the housing 10 in a vacuum atmosphere. The open end of the vacuum port 22, oriented within the working chamber 14, is covered with a mesh filter 23.

An electron gun unit 24 is disposed within the electron gun chamber 12. As is well known, the electron gun unit 24 comprises a filament 26, an electron gun 28 and an anode 30. On the other hand, a lower jig 32 for holding the workpiece 16 is provided in the working chamber 14. The lower jig 32 employed in the shown embodiment is provided with a driving means, such as an electric motor or the like, for rotatingly driving the workpiece 16 thereon. An upper pressure jig 34 is also provided in the working chamber 14. As seen, the upper pressure jig 34 is mounted on the workpiece 16 for providing compression force to the workpiece 16. The upper pressure jig 34 defines an elongated through the opening 36 which extends in a radial direction of the workpiece. The opening 36 serves to permit an electron beam 38 to reach the workpiece 16. A deflector assembly 40, having a deflector coil 42, is provided in the electron beam path 18 for radially deflecting the electron beam 38 along the elongated opening 36. The deflector coil 42 is electrically connected to an external control circuit (not shown) so that the deflecting magnitude of the electron beam 38 can be adjusted to irradiated the electron beam 38 to the portion or point on the workpiece 16 to be welded.

In addition, an observation window 44 is formed in the electron beam path 18 so that the condition of the workpiece 16 can be observed via a reflector or half mirror 46 and a lens 48. Also, a column valve 49 is provided for shutting off the electron gun chamber 12 and for blocking communication between the working chamber 14 and the electron beam path 18. The column valve 49 may be constructed in a manner well known to those skilled in the art and is designed for maintaining the atmosphere within the electron gun chamber 12 in a vacuum state even when the working chamber 14 and the electron beam path 18 are opened to the atmosphere for resuming the atmospheric pressure upon removal of the workpiece 16 or insertion of a new workpiece. For enabling removal of the welded workpiece or insertion of the new workpiece to be processed in a batch process, the housing 10 may have a sealable door (not shown) with a work-handling opening.

Figure 2:
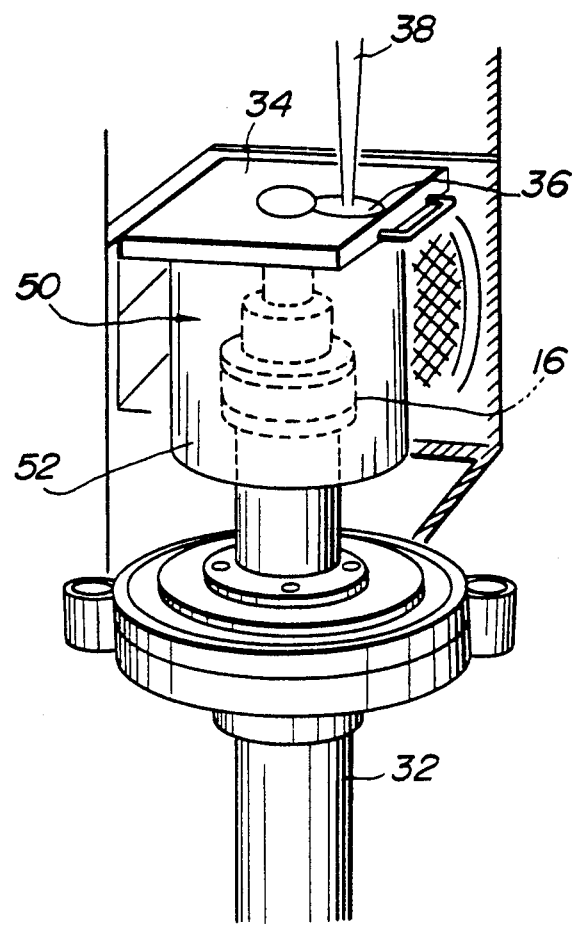
FIG. 2 is an perspective view of the preferred embodiment of the spatter catching device according to the present invention.
Figure 4:
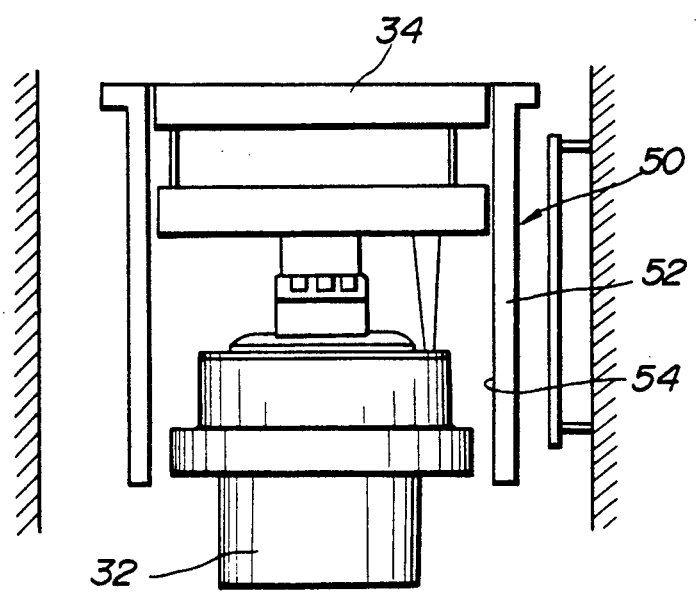
FIG. 4 is an enlarged section of the preferred embodiment of the spatter catching device of FIG. 2.
Figure 3:
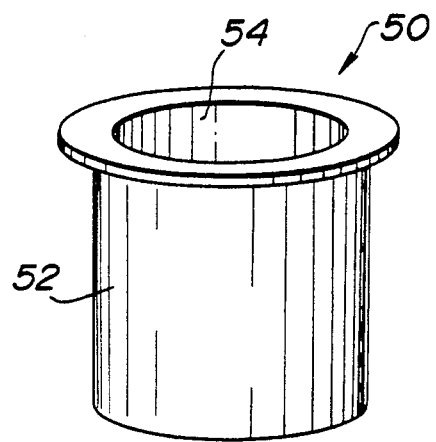
FIG. 3 is a perspective view of the preferred embodiment of the spatter catching device of FIG. 2.

As shown in FIGS. 2, 3 and 4, the preferred embodiment of a spatter catching device 50 is provided within the working chamber 14. In practice, the spatter catching device 50 is formed of a generally cylindrical apron cover 52. The apron cover 52 is supported on the upper pressure jig 34 and arranged surrounding the workpiece 16. The length of the apron cover 52 is determined so as to place the lower end edge thereof at an elevation below the irradiation point of the electron beam 38. Specifically, as can be seen particularly in FIG. 3, since the welding spatter generated at the arcing point flies thereabout as illustrated and rarely flies below the arcing point, the only essential area to be covered by the apron cover 52 is in the region above the arcing point. A spatter catcher layer 54 is formed on the inner periphery of the apron cover 52, and is formed of a material which is easily removed. For example, the shown embodiment employs a polishing powder as the material for forming the spatter catcher layer 54. The polishing powder is applied on the overall surface on the inner periphery of the apron cover 52 in the usual manner. In experiments involving the invention, it was found that the polishing powder can be easily removed by means of a wire brush even after repeating arcing operations. On the other hand, since the welding spatter is absorbed on or adhered to the surface of the polishing powder, the welding spatter can be easily removed by removing the polishing powder layer.

It should be appreciated that though the shown embodiment employs polishing powder for forming the spatter catcher layer 54, the material for forming the spatter catcher layer is not specified or limited to the polishing powder but can be replaced with any appropriate material. The only essential properties of the material to use for forming the spatter catcher layer 54 are magnetically non-conductivity, for preventing generation of magnetic fields which affect the electron beam 38, heat resistance so that the layer may not be damaged by high temperature welding spatter, and ease of removal from the inner periphery of the apron cover 52. For example, a synthetic resin having a high heat resistance and peeling ability may also be considered as a good material for forming the spatter catcher layer 54.

In the shown embodiment, it is preferred to orient the apron cover 52 in such a manner that the axis thereof is offset from the axis of the workpiece for positioning the wall section corresponding to the arcing point on the workpiece at a greater distance than other sections. Greater distance at the arcing point is preferred because greater spatter may adhere on the corresponding spatter catcher layer 54.

Figure 5:
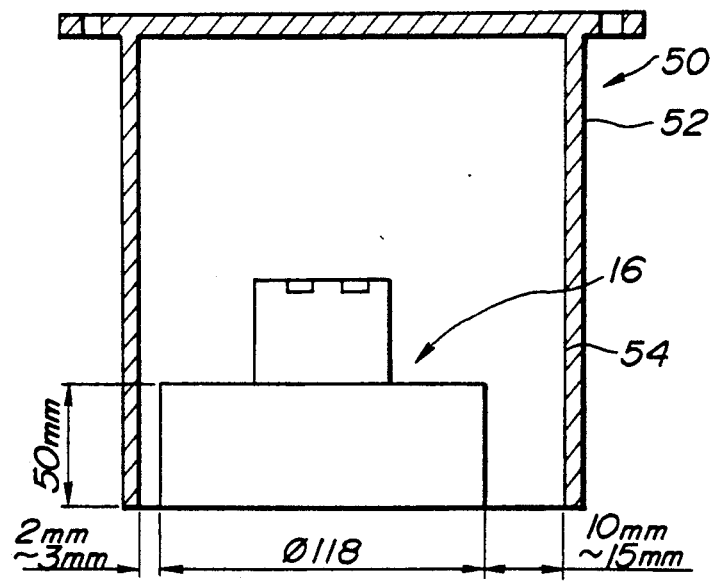
FIG. 5 is a sketch showing the dimensional relationship between a workpiece and the preferred embodiment of the spatter catching device according to the invention, as utilized for implementation.

The shown embodiment of the spatter catching device 50 is implemented and used in the electron beam welding machine for welding an internal gear assembly for an automotive automatic power transmission. The welding process is performed in a batch process. Because of such batch process, the pressure in the working chamber 14 is initially maintained at the atmospheric pressure. The internal gear assembly as the workpiece 16 is entered into the working chamber 14 and set on the lower jig 32. The upper pressure jig 34 with the preferred embodiment of the spatter catching device 50 is mounted on the internal gear assembly 16 before the internal gear assembly 16 is entered into the working chamber 14 and set on the lower jig 32. At completion of the setting of the upper pressure jig 34, the apron cover 52 of the spatter catching device is placed as illustrated in FIG. 5. Specifically as shown in FIG. 5, the external diameter of the internal gear assembly, identified by the reference numeral 16 as the workpiece, is 118 mm. The section 52a of the apron cover 52, which section is oriented closest to the arcing point 38a, is set at a distance of approximately 10 to 15 mm. On the other hand, the section 52b of the apron cover 52 oriented at the opposite side of the arcing point 38a, is distanced from the internal gear assembly 16 at a distance of approximately 2 to 3 mm. Offsetting of the section 52a of the apron cover 52 with respect to the internal gear assembly 16 to provide a greater distance than other sections may expand the cleaning cycle of the apron cover 52. On the other hand, a relatively small distance between the apron cover 52 and the internal gear assembly 16 is preferred to limit the amount of welding spatter to be accumulated thereon. That is, as set forth above, the welding spatter left or adhering on the wall section in the working chamber 14, including the inner periphery of the spatter catcher device 50, may maintain air for causing expansion of the vacuuming process to obtain the desired magnitude of vacuum pressure in the working chamber 14. Furthermore, the accumulated welding spatter may influence the electron beam to cause toleration of the welding quality.

After setting the internal gear assembly 16, the jigs 32 and 34 and the spatter catching device 50, vacuum pressure is introduced into the working chamber 14 for lowering the pressure in the working chamber 14 to a predetermined magnitude. After adjusting the pressure in the working chamber 14 and the electron beam path 18 at the desired vacuum pressure level, the column valve 49 is opened to establish communication between the electron gun chamber 12 and the working chamber 14 so that the electron beam 38 can reach the internal gear assembly 16. Thereafter, the deflector coil 42 of the deflector assembly 40 is operated to adjust the radial position of the electron beam 38 so that the electron beam 38 can be accurately or precisely irradiated on the desired welding point.

After the welding operation, the column valve 49 is again closed for separating the electron gun chamber 12 from the electron beam path 18 and the working chamber 14. Then, the working chamber 14 is opened to the atmosphere to increase the pressure to the atmospheric pressure. Thereafter, the internal gear assembly 16 with the upper pressure jig 34 and the spatter catching device 50 are pulled out from the working chamber 14. For handling the internal gear assembly 16, the upper pressure jig 34 and the spatter catching device 50, it is convenient to provide a gripper handle 58 (not shown) for the upper pressure jig 34 or the apron cover 52.

After removal from the working chamber, the upper pressure jig 34 and the spatter catching device 50 are removed from the internal gear assembly 16. At this time, the amount of the welding spatter accumulated on the periphery of the apron cover 52 is checked. When a relatively large amount of spatter is accumulated, the apron cover 52 is subjected to a cleaning process for removing the spatter, together with the polishing powder as the spatter catcher layer 54. After cleaning, new polishing powder 54 is applied on the inner periphery of the apron cover 52 for forming a new and refreshed spatter catcher layer 54.

Through practical implementation it has been found that substantially no welding spatter is accumulated on the inner periphery of the working chamber 14. Also, substantially no spatter is collected at the mesh filter 23 on the end opening of the vacuum port 22. Furthermore, as can be appreciated, substantially no welding spatter flies out of the spatter catching device 50 and thus, no small spatter can enter into the vacuum pump as the vacuum source. Therefore, lubricant in the vacuum pump cannot be contaminated and can thus be used for a longer period of time. Furthermore, by restricting welding spatter within the working chamber, efficiency of the vacuuming process becomes greater, e.g. about twice as much as in conventional apparatuses. In the experiments performed in terms of the conditions set forth above, the vacuuming process period is shortened from approximately 17.6 sec to approximately 9.4 sec. As can be appreciated, since the welding process is performed in a batch process, reduction of the process period for establishing the predetermined magnitude of vacuum substantially improves efficiency of production.

In addition, by utilizing the spatter catcher layer 54 on the periphery of the apron cover 52, removal of the spatter adhering thereto becomes simple and easy. In practice, when the spatter catcher layer 54 is not provided, the period required for the cleaning process of the apron cover 52 was approximately 34 min. This cleaning period was shortened to 11 min. by providing the spatter catcher layer 54. However, even by utilizing the bare apron cover 52 without a spatter catcher layer 54, the period required for cleaning can be shortened to about 30 min., in comparison with that in conventional electron beam welding apparatuses. Furthermore, since the cleaning process of the apron cover 52 can be performed in parallel with the operation of the welding apparatus, the bare apron cover 52, without the spatter catcher layer 54, is still effective for significantly improving the electron beam welding apparatus. Therefore, utilization of a bare apron cover 52 is still within the present invention.

On the other hand, though the shown embodiment is directed to use of the apron cover 52 with the spatter catcher layer 54, it may be possible to directly apply the spatter catcher layer 54 on the inner periphery of the housing 10 of the welding apparatus. Even by this method, the spatter catcher layer 54 on the inner periphery of the housing 10 makes it easier to remove the spatter from the inner periphery, thereby achieving substantial and significant improvement for the conventional electron beams welding apparatus. Thus, although the shown embodiment is preferred, application of the spatter catcher layer 54 directly on the inner periphery of the housing 10 should be regarded as still within the scope of the present invention.

While the present invention has been discussed hereabove in terms of the preferred embodiment of the invention and modifications thereof, the invention may be embodied in various ways. Therefore, any embodiments and modifications thereof which are implemented without departing from the principal of the invention as defined in the appended claims, are within the scope of the invention.

What is claimed is:

1. An electron beam welding apparatus comprising:
    a hollow housing defining a working chamber, in which electron beam welding is performed;
    an electron gun for generating an electron beam for irradiating a workpiece within said working chamber; and
    a welding spatter catching means for surrounding said workpiece and for preventing welding spatter from directly adhering to the inner periphery of said housing, said welding spatter catcher means including a spatter catcher layer for facilitating the easy removal of spatter formed in the inner periphery thereof, which spatter catcher layer is formed of a material which is magnetically non-conductive and has a high heat resistance property for the easy removal of spatter from the inner periphery of said cover member.

2. An electron beam welding apparatus as set forth in claim 1, wherein said welding spatter catching means comprises a cover member surrounding said workpiece for localizing accumulation of welding spatter thereon.

3. An electron beam welding apparatus as set forth in claim 2, wherein said cover member is removably installed within said working chamber.

4. An electron beam welding apparatus as set forth in claim 3, wherein said cover member is assembled together with said workpiece before placement within said working chamber and removed together with said workpiece from said working chamber.

5. An electron beam welding apparatus as set forth in claim 4, wherein said cover member is made of a magnetically non-conductive material.

6. An electron beam welding apparatus as set forth in claim 2, wherein said cover member is oriented with respect to said workpiece so that the axis thereof is offset from the axis of said workpiece for orienting the portion directly mating with an arcing point at a distance greater than the other portions.

7. An electron beam welding apparatus as set forth in claim 6, wherein the distance from said arcing point to the directly mating portion of said cover member is greater than or equal to 10 mm.

8. An electron beam welding apparatus as set forth in claim 1, wherein said material for forming said spatter catcher layer is polishing powder.

9. An electron beam welding apparatus as set forth in claim 1, wherein said material for forming said spatter catcher layer is a clay.

10. An electron beam welding apparatus as set forth in claim 1, wherein said material for forming said spatter catcher layer is a thin metal having high heat resistance and which is magnetically non-conductive.

11. An electron beam welding apparatus as set forth in claim 1, wherein said material for forming said spatter catcher layer is a synthetic resin having high heat resistance and which is magnetically non-conductive.

12. An electron beam welding apparatus as set forth in claim 1, wherein said cover member is removably installed within said working chamber.

13. An electron beam welding apparatus as set forth in claim 12, wherein said cover member is assembled with said workpiece before placement within said working chamber and removed together with said workpiece from said working chamber.

14. An electron beam welding apparatus as set forth in claim 13, wherein said cover member is made of a magnetically non-conductive material.

15. An electron beam welding apparatus as set forth in claim 1, wherein said cover member is oriented with respect to said workpiece so that the axis thereof is offset from the axis of said workpiece for orienting the portion directly mating with an arcing point at a distance greater than the other portions.

16. An electron beam welding apparatus as set forth in claim 15, wherein the distance from said arcing point to the directly mating portion of said cover member is greater than or equal to 10 mm.

17. An electron beam welding apparatus as set forth in claim 1, wherein said welding spatter catching means comprises a spatter catcher layer formed on the inner periphery of said working chamber.

18. An electron beam welding apparatus as set forth in claim 17, wherein said spatter catcher layer is formed of a material which is magnetically non-conductive and has high heat resistance and property for easy removal from the inner periphery of said working chamber.

19. An electron beam welding apparatus as set forth in claim 17, wherein said material for forming said spatter catcher layer is polishing powder.

20. An electron beam welding apparatus as set forth in claim 17, wherein said material for forming said spatter catcher layer is a clay.

21. An electron beam welding apparatus as set forth in claim 17, wherein said material for forming said spatter catcher layer is a thin metal having high heat resistance and which is magnetically non-conductive.

22. An electron beam welding apparatus as set forth in claim 17, wherein said material for forming said spatter catcher layer is a synthetic resin having high heat resistance and which is magnetically non-conductive.

23. An electron beam welding apparatus comprising:
a hollow defining a working chamber, in which electron beam welding is performed;
a pressurizing jig mounted on a workpiece for exerting pressure onto said workpiece at least at the portion to be welded;
an electron gun for generating an electron beam for irradiating a workpiece within said working chamber; and
a welding spatter catching means, assembled with said pressurized jig for installation and removal therewith, for surrounding said workpiece and for preventing welding spatter from directly adhering to the inner periphery of said housing.

24. An electron beam welding apparatus comprising:
a hollow housing defining a working chamber, in which electron beam welding is performed;
an electron gun for generating an electron beam for irradiating workpiece within said working chamber; and
a welding spatter catching means, removably assembled to said workpiece for installation into and removal from said working chamber therewith, for surrounding said workpiece and for preventing welding spatter from directly adhering to the inner periphery of said housing.

25. An electron beam welding apparatus comprising:
a hollow housing defining a working chamber, in which electron beam welding is performed;
an electron gun for generating an electron beam for irradiating a workpiece within said working chamber; and
a welding spatter catching means for surrounding said workpiece and for preventing welding spatter from directly adhering to the inner periphery of said housing, said welding spatter catcher means including a spatter catcher layer removably coating the inner periphery of said welding spatter catching means for facilitating the easy removal of welding spatter adhered to the inner periphery thereof.

26. An electron beam welding apparatus comprising:
a hollow housing defining a working chamber, in which electron beam welding is performed;
an electron gun for generating an electron beam for irradiating a workpiece within said working chamber; and
a welding spatter catching means formed independently of said housing for installation into and removal from said working chamber, for surrounding said workpiece and for preventing welding spatter from directly adhering to the inner periphery of said housing.

* * * * *